United States Patent
Schoenwolf et al.

(10) Patent No.: US 7,127,478 B1
(45) Date of Patent: Oct. 24, 2006

(54) DATA BASE FOR PERSISTENT DATA

(75) Inventors: Gerd Schoenwolf, Augsburg (DE); Petra Brendel, Munich (DE); Stefan Ziemski, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/282,145

(22) Filed: Mar. 31, 1999

(30) Foreign Application Priority Data

Apr. 29, 1998 (DE) ................................ 198 19 205

(51) Int. Cl.
*G06F 17/30* (2006.01)

(52) U.S. Cl. .................. 707/204; 707/202; 707/205

(58) Field of Classification Search ................ 707/103, 707/104, 200, 201; 709/227, 217
See application file for complete search history.

(56) References Cited

U.S. PATENT DOCUMENTS

| 5,247,669 | A |   | 9/1993 | Abraham et al. |
| 5,341,493 | A |   | 8/1994 | Yanai et al. |
| 5,412,612 | A |   | 5/1995 | Oyama |
| 5,481,699 | A | * | 1/1996 | Saether .................. 395/182.13 |
| 5,524,205 | A | * | 6/1996 | Lomet et al. .................. 714/16 |
| 5,594,881 | A | * | 1/1997 | Fecteau et al. ............. 709/227 |
| 5,634,050 | A | * | 5/1997 | Krueger et al. ............. 707/200 |
| 5,721,918 | A | * | 2/1998 | Nilsson et al. ............... 707/201 |
| 5,898,868 | A | * | 4/1999 | Krueger et al. ............. 707/200 |
| 5,926,631 | A | * | 7/1999 | McGarvey .................. 395/500 |
| 5,946,467 | A | * | 8/1999 | Pathakis et al. ............. 709/217 |
| 6,278,999 | B1 | * | 8/2001 | Knapp ............................ 707/9 |
| 6,301,582 | B1 | * | 10/2001 | Johnson et al. ............. 707/103 |
| 6,438,562 | B1 | * | 8/2002 | Gupta et al. ................. 707/201 |
| 6,785,768 | B1 | * | 8/2004 | Peters et al. ................. 711/112 |

FOREIGN PATENT DOCUMENTS

| AU | 23719 B1 | 10/1999 |
| DE | 33 23 435 C2 | 1/1985 |
| DE | 196 26 337 | 1/1997 |
| EP | 0 631 220 A2 | 12/1994 |
| EP | 0 672 983 A1 | 9/1995 |
| EP | 0 690 375 A2 | 1/1996 |
| EP | 0 829 805 A1 | 3/1998 |
| WO | WO 96/34336 | 10/1996 |
| WO | WO 97/33225 | 9/1997 |

OTHER PUBLICATIONS

The Magazine for Clients/Server Computing, "Datenhaltung Für Gekapselte Systeme (1), Kompakt-DB Für Technische Geräte", (1998), pp. 42-45.

The Magazine for Clients/Server Computing, Datenhaltung Für Gekapselte Systeme (2), Datenbank für Echtzeittransaktionen, (1998), pp. 35-38.

* cited by examiner

*Primary Examiner*—Jean M. Corrielus
(74) *Attorney, Agent, or Firm*—Bell, Boyd & Lloyd LLC

(57) ABSTRACT

A data base for permanent data has a first memory from which date is written into a buffer. Data is transferred from the buffer store into at least two permanent memories.

27 Claims, 5 Drawing Sheets

DATA BASE FOR PERSISTENT DATA

BACKGROUND OF THE INVENTION

The invention relates to a data base for permanent data.

Embedded systems for controlling electronic devices must have high reliability. As a rule, their response times to instructions supplied from outside must be very short. In most cases they are also subject to severe hardware restrictions. To ensure data integrity, the data must be stored with buffer power supply and permanently. It is therefore necessary to use appropriate data bases comprising permanent stores.

Using hard-disk stores as permanent stores presents problems for reasons of reliability because of their relatively short service life and the sensitivity to temperature fluctuations.

SUMMARY OF THE INVENTION

It is an object of the present invention to provide a data base which meets the above requirements and, in addition, can be implemented in a more reliable and also more inexpensive manner.

In general terms the present invention is a data base for permanent data comprising a buffer store into which all data to be stored permanently is written, and comprising a permanent store connected to the buffer store, which exhibits at least two storage units or storage areas in each of which all the permanent data from the buffer store is stored.

Advantageous developments of the present invention are as follows.

A control mechanism within an application process comprising the management of a first store controls the writing of the data to be stored permanently into the buffer store which is generated or modified by the application process alone or also by other application processes running at the same time.

In the case where a number of application processes are running at the same time, a responsible control mechanism within an application process, by exchanging messages with the control mechanisms of other application processes running at the same time, controls the accesses, required for loading the data to be stored permanently, of the individual application processes running at the same time, to the buffer store using process identification numbers, entered in a shared store, of the application processes running at the same time.

All the permanent data stored in the buffer store is alternately in each case written into one of the storage units or storage areas of the permanent store.

Only modified data sequences are alternately written into affected storage segments of the permanent store.

The modified data sequences are written into the affected storage segments of the permanent store at particular time intervals.

The modified data sequences are written into the affected storage segments of the permanent store after a certain number of modifications.

Only the permanent data, if necessary including the reconstruction data, are transferred into the buffer store from a first store which contains a run-time program and the associated permanent data.

The data is stored in a space-saving manner as data sequence in the buffer store and in a permanent store.

At least one further permanent store is provided for a start program and application software including data base management software, using the configuration data to be written into the first store, are automatically reconstructed from the permanent data stored in the permanent store.

If the construction data which can be used for reconstruction is present in the buffer store, the configuration data to be written into the first store can be automatically recovered from the reconstruction data stored in the buffer store.

At least two random access memories, functionally connected in series, are provided as buffer stores, the permanent data stored in the first one being written into the second one so that the first random access memory is available for reloading while the permanent data from the second or a further random access memory is written into the permanent store.

Loadable Flash Erasable Programmable Read Only Memory chips are provided as a permanent store.

The data base is provided for the permanent configuration of functions and/or characteristics of a terminal and, especially, of its terminal cards.

A number of configurations are stored and one of these configurations can be selected for the hardware implementation.

First a number of configuration changes are only performed at the data management side and that then a functional and/or hardware change comprising all configuration changes is performed in the terminal.

The essential advantage of the invention lies in the interaction of a fast buffer store with a permanent store which can be loaded only slowly. As a result, instructions can be taken into the buffer store very rapidly and, as a result, the response times can be kept short while data are written from the buffer store into the permanent store independently of this process.

So that the data to be stored permanently, which are modified by possibly a number of application processes running in parallel, are stored consistently in the buffer store, one of the control mechanisms of the application processes running is made responsible for controlling the access to the buffer store. The responsible control mechanism can co-ordinate the access of the application processes to the buffer store with the aid of process identification numbers, entered in a shared store, of the application processes running simultaneously.

The use of flash EPROMS (FEPROM—Flash Erasable Programmable Memory) as permanent stores which can be loaded with little circuit complexity is advantageous. The use of two FEPROM chips or two storage areas of a FEPROM store into which all necessary data are written alternately offers decisive advantages for restarting the system. In the case of an error during the write process (due to a power failure in the worst case) the previously valid complete data record is available in the other storage area.

Where high failure tolerance is required, it is of advantage if more than two flash EPROMs are available as permanent stores due to the short service life of the flash PROMS. To reduce the volume of data to be stored, only the data necessary for the configuration is permanently stored. The service life of the flash EPROMs is increased by, among other things, a read/write process to the permanent memory not being performed after each change of the data to be stored permanently but after a certain number or, respectively, at particular time intervals.

The data base is especially suitable for the configuration of electronic devices, for example data terminals. In the case of a disturbance or a deliberate restart, all necessary data of the application for determining the terminal configuration are reconstructed (or taken over directly in the case of very simple data bases) from the permanently data stored using programs also stored permanently.

The capability of preparing one or more configurations at the data end and to perform these only at a later time is also advantageous.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
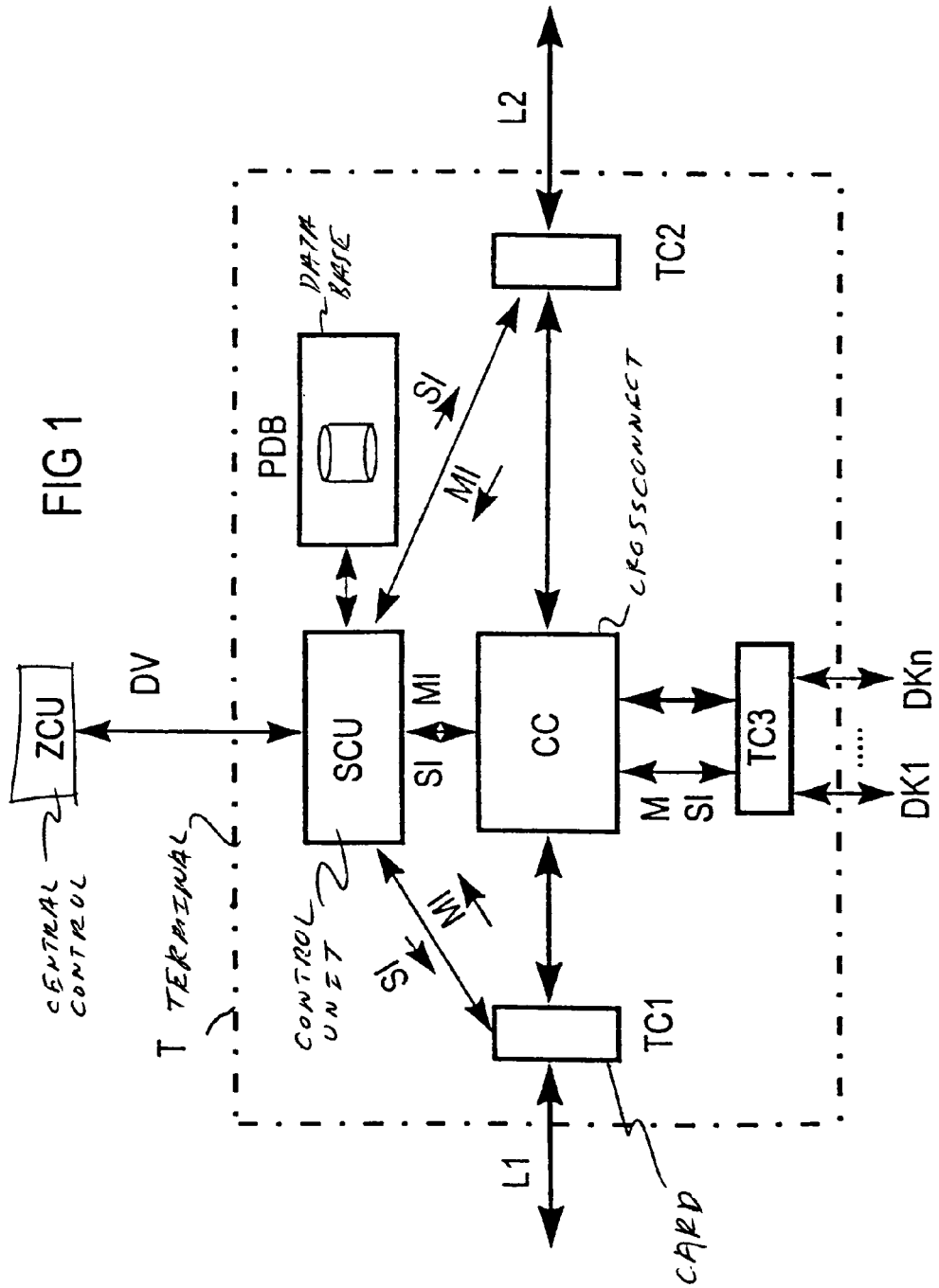
FIG. 1 shows an electronic terminal including the data base according to the invention.

FIG. 1 shows an electronic terminal T as a block diagram as an example for the use of the data base according to the invention. This terminal is a synchronous multiplexer which exchanges data bidirectionally with other terminals via a first data link L1 and a second data link L2. These data are conducted via terminal cards TC1, TC2 and TC3 via a cross connect CC which drops and inserts individual bidirectional data channels DKI to DKn from the external data streams. In addition, the data channels can be re-ordered in the cross connect before being sent on by the terminal.

The configuration (operating mode) of the cross connect determines, for example, which channels are dropped. Its configuration and the operation of the terminal cards are determined by a system control unit SCU which receives its instructions via a data link DV from a central control unit ZCU. The instructions (commands) from the latter are translated by the system control unit SCU and forwarded in converted form as control information SI to the modules of the terminal where the (hardware) configuration is performed.

The modules of the terminal forward alarm and status messages MI to the system control unit which translates them and forwards them to the central control unit or possibly, for example, performs switching-to-standby operations itself. So that the configuration previously set can be re-established in the event of a power failure, all data necessary for the configuration, here called configuration data, must be stored in a permanent data base PDB.

Figure 2:
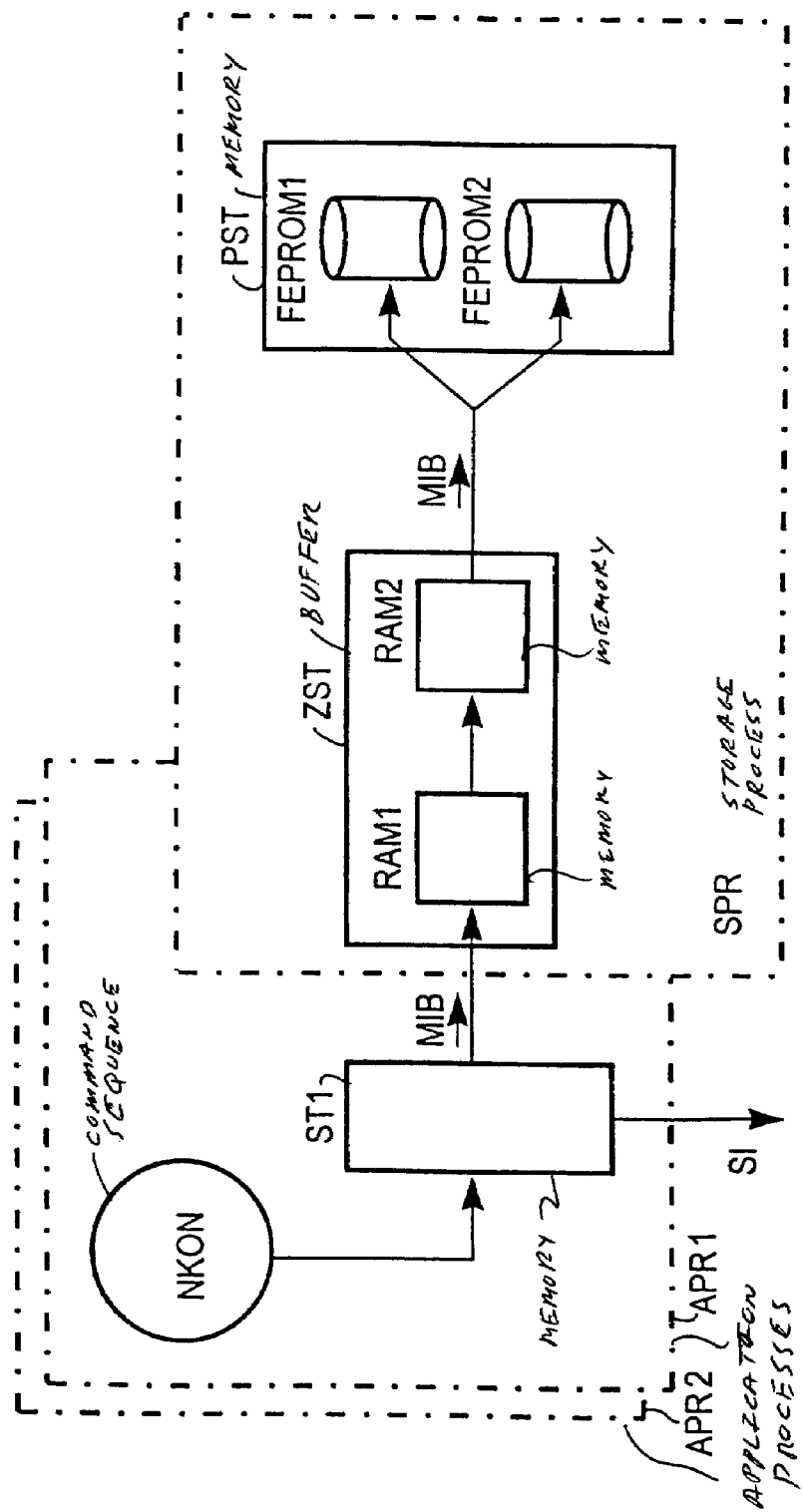
FIG. 2 shows a basic circuit diagram of the data base.

FIG. 2 shows the permanent data base PDB as basic circuit diagram. All configuration data IS stored in a first MEMORY ST1, a random access memory (RAM), for example, in the form of a so-called object model. Such an object model contains both functional and permanent data (configuration data), here used for configuring the terminal, which are called management information base (MIB).

In the event of a reconfiguration, triggered by a command sequence NKON in FIG. 2, first the configuration data are changed in the first memory ST1 and sent, translated into the control information SI, to the modules affected where the hardware configuration takes place. The data is written into the permanent memory PST by a background process, the storage process SPR, the range of action of which is specified by a frame in FIG. 2.

The data base ensures that the configuration data, possibly including the construction data, stored as an object model in the first memory ST1, is stored in a space-saving manner, dispensing with predetermined fixed storage areas, in a buffer store ZST as a stream (data sequence). After that, the transaction performed, for example a reconfiguration of the terminal, can be confirmed and subsequently a further transaction can be performed. Such a transaction involves an application process, e.g. APR1 and possibly other application processes running in parallel, for example, APR2.

The buffer store is formed from at least two random access memories RAM1 and RAM2 or, respectively, at least two storage areas of a RAM, connected functionally in series, which will also be called store in the text which follows. The data stored in the first random access memory is transferred into the second random access memory and is controlled by a memory management system so that the first random access memory RAM1 is available for new storage of data of another configuration. The data stored in the second random access memory RAM2 can now be written into a permanent store PST=FEPROM1 and FEPROM2 or, if necessary, stored in other random access memories not shown, and from there pass into the permanent memory.

Two flash EPROMs FEPROM1 and FEPROM2 or, respectively, two storage areas of a larger memory are provided as a permanent memory by way of example. In the case of relatively small data volumes, it is also conceivable to use different storage areas of a FEPROM chip. To provide additional failure tolerance, more than two flash EPROMs can also be available as a permanent memory which are cyclically loaded.

All permanent data MIB is in each case stored alternately in the first and second FEPROM or, respectively, storage area. In the case of relatively large volumes of data it makes sense only to copy altered data into the affected segments (for example, 64 kbytes) of the permanent store. In this arrangement, the process of copying the data to be stored permanently into the permanent store is performed either after each change of data, after a particular number of changes or in particular time intervals.

Although writing data into the FEPROMs requires a relatively large amount of time, this is not critical due to the buffer storage since the different processes are decoupled in turn due to the fact that the permanent data MIB is copied into the buffer store. The more "storage stages" there are in the buffer store, the more configurations following one another in brief succession can be buffered and therefore reconstructed in the event of a deliberate system restart.

If there is a power failure during the loading, the data MIB not yet written into the permanent store PST is lost but the data record previously determining the configuration, the preceding MIB stored permanently, still exists in the other FEPROM so that a valid configuration can be reconstructed.

Figure 3:
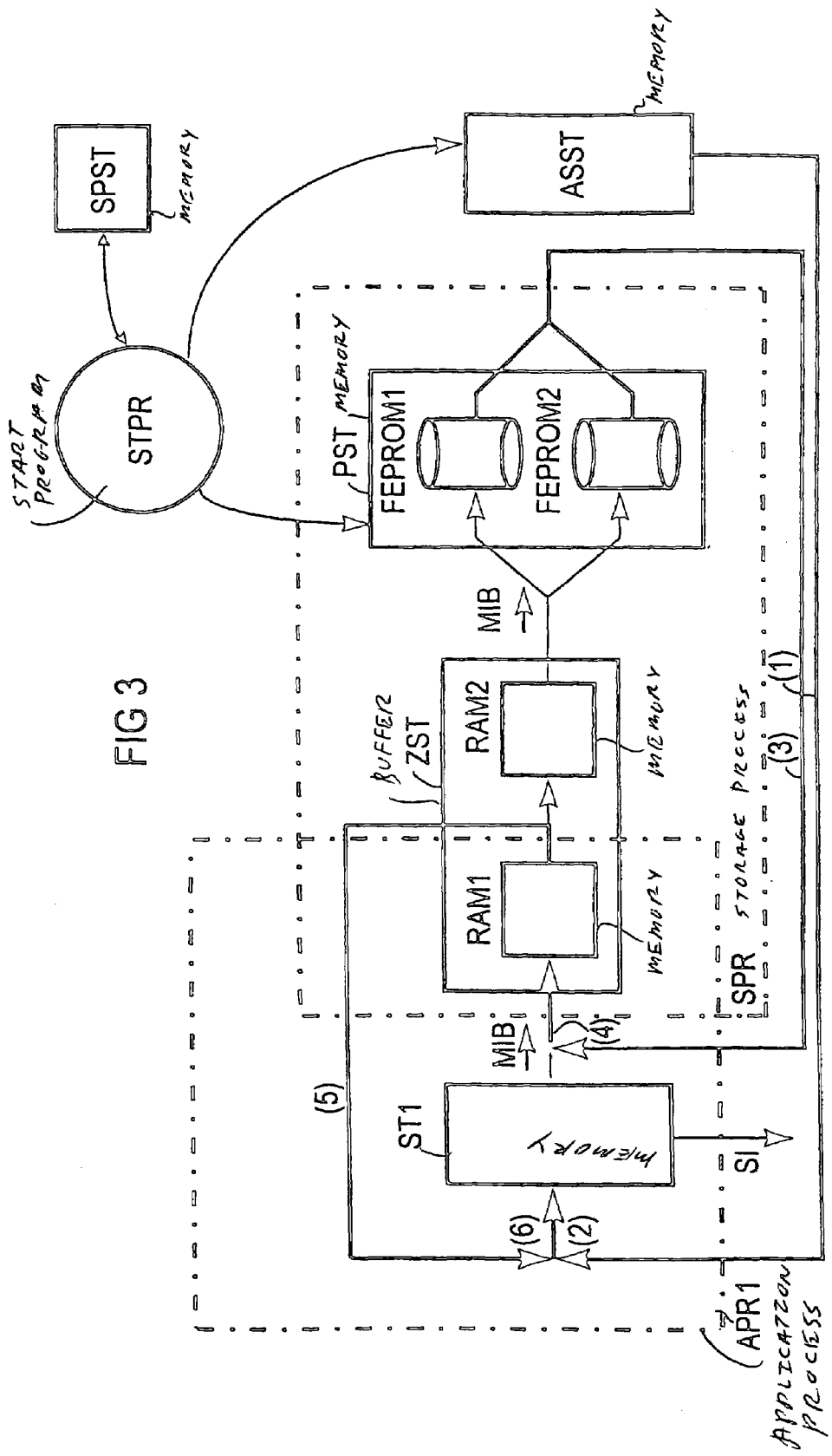
FIG. 3 shows a basic circuit diagram for explaining the system restart.

FIG. 3 will be used for explaining a restart after a power failure in greater detail. The restart is performed with the aid of a start program STPR which is stored in a permanent program memory SPST. The start program first loads an application of software also stored permanently in a memory ASST and including data base management software, into the first memory ST1 (1), (2). Then a complete record of permanent data MIB is loaded from one of the FEPROMs into RAM1 (3), (4) to have faster access capabilities. This is followed by the automatic reconstruction (6), on request (5)

under program control, of the configuration data in the application by means of the data base so that an executable program is restored.

FIGS. 2 and 3 do not show any computing units. Their functions are symbolized by the storage process SPR only relating to the permanent store and the application process APR1 comprising the management of the first memory.

In the event of a system restart triggered by software in the central control unit or system control unit, the operating system deletes the content of the first memory ST1. However, the content of the buffer memory ZST is retained so that reconstruction data which can be used for reconstruction is present in the buffer and the reconstruction (5) and (6) can be begun immediately from the buffer. In very simple data bases, the data of the first memory ST1 can also be transferred directly into the buffer ZST and from the latter into the permanent memory PST. If the timing conditions are not critical, the buffer can also consist of only one random access memory.

Figure 4:
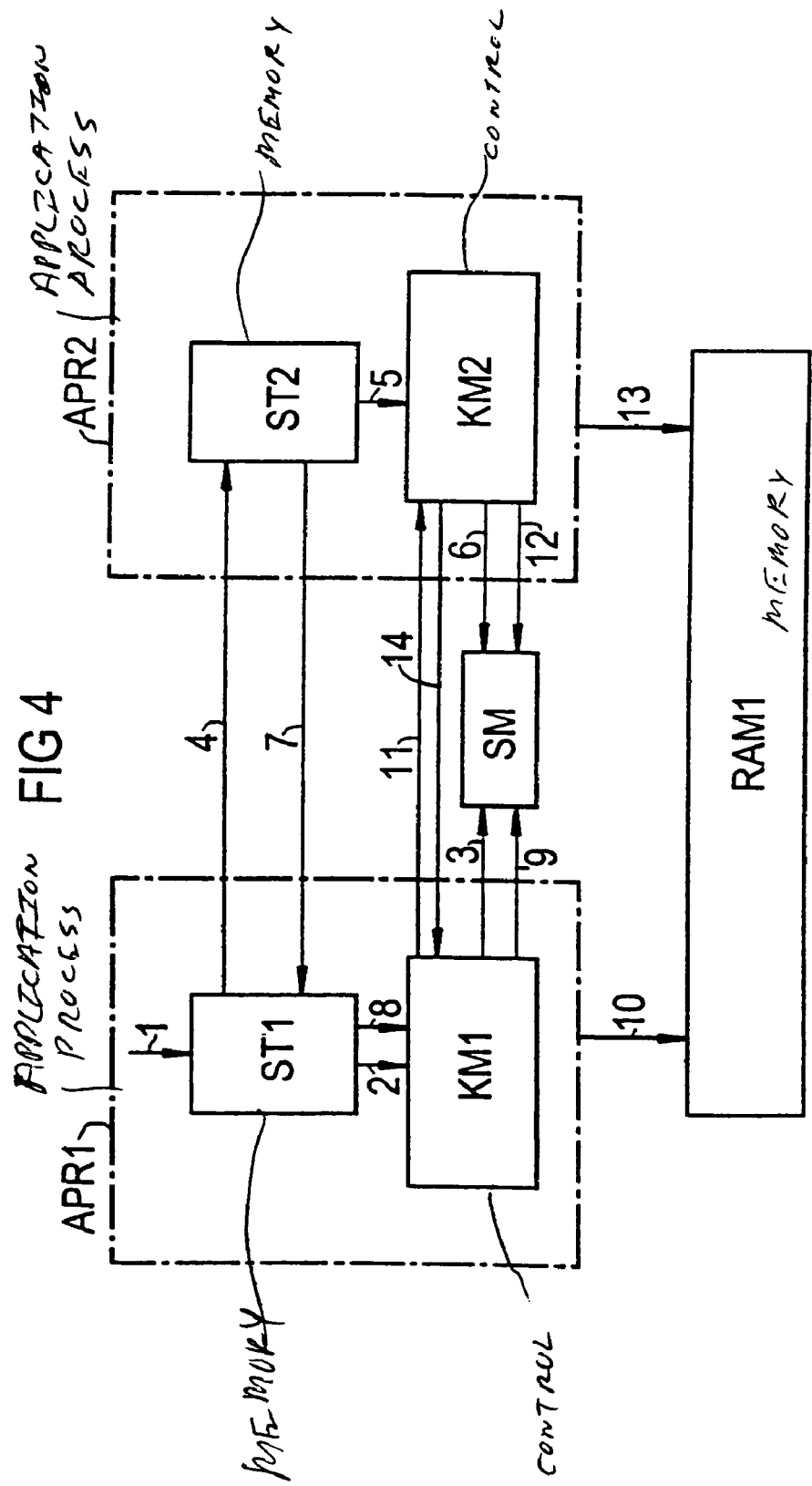
FIG. 4 shows flow chart for controlling the access of application processes running in parallel.

FIG. 4 shows a flow chart for controlling the access, for example of two application. processes running in parallel. The access control can also be expanded to more than two application processes running in parallel.

Among the experts of data bases, such an access control belongs to a so-called transaction control. By definition, a transaction represents a sequence of data processing commands such as, for example, read, modify, insert, delete which sets the data base, that is to say the first random access memory RAM1 in the buffer ZST in the example, from one consistent state to another consistent state which is not necessarily different. A transaction is normally subdivided into an execution phase and a so-called commit phase (data comparison and storage phase).

During the execution phase, the control mechanisms KM1 and KM2 which belong to application processes APR1 and APR2, respectively, note the data which were changed in the first stores ST1 and ST2. In addition, an unambiguous process identification number is stored for each application process which modifies data to be stored permanently, in a shared store SM. This process identification number is analyzed in the commit phase in order to identify all application processes which were involved in the transaction. In all application processes involved, a message exchange ensures that modified data are also stored permanently.

The control mechanism, for example KM1, of the application process APR1 is responsible for the transaction which is activated (1) via the application process APR1. In the execution phase (2) to (7), data to be stored permanently are modified in both application processes. The control mechanisms are informed of each modification (2) and (5). On the basis of this information, the control mechanisms allocate an unambiguous process identification number (3) and (6) to the respective application process in the shared store. Other steps relating to the exchange of messages between the application processes are identified by (4) and (7).

The commit phase which follows the execution phase is activated by the responsible control mechanism, for example KMI of application process APR1 (8). Since the application process APR1 is identified in the shared store, the data to be stored permanently, which were modified by application process APR1, are written (10) into the random access memory RAM1. The associated process identification number is removed (9) from the shared store. The responsible control mechanism now identifies the application process APR2 which must write data to be stored permanently into the random access memory RAM1. The application process APR1 sends a message (11) to the application process APR2. In application process APR2, the data to be stored permanently and modified by it are written into (13) the random access memory and the process identification number is deleted (12) in the shared store. The application process APR2 sends a message (14) when it has finished writing its modified data to be stored permanently into the random access memory to application process APR1. The data stored in the random access memory are now consistent and the transaction is concluded.

Figure 5:
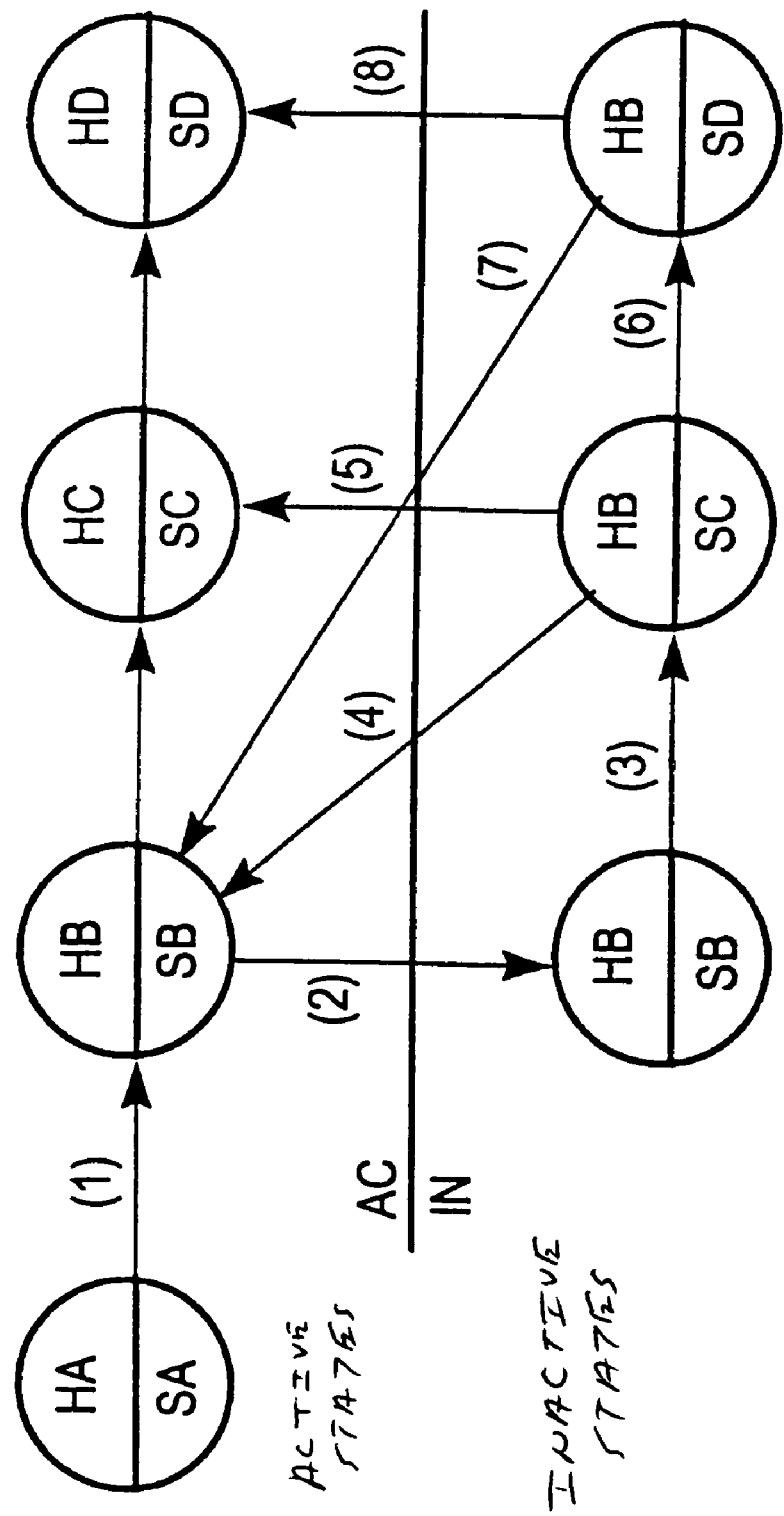
FIG. 5 shows a hardware status diagram.

FIG. 5 shows the hardware states of a module. In the upper half AC (active) of the representation, the current configuration states HA, HB, HC, HD implemented in hardware correspond to the configuration states SA, SB, SC, SD given as data. In the case of a reconfiguration (1) of the configuration states SA, HA, these can be transformed directly into configuration states SB and HB by software (S) and hardware. The existing configuration states SB, HB can also be transferred into an inactive state IN from the active state AC in a step (2). In the inactive state, only the data state can be changed from SB to SC and further (6) into SD in a further step (3) which, however, does not yet change the actual (hardware) configuration HB. In the inactive state, the user can either reach the previous configuration state HB (default configuration) by step (4) or reach the new configuration state HC in a step (5) from SC/HB.

This correspondingly applies to the data state SD from which again the default configuration HB (7) or, in a step (8), the corresponding hardware state HD can be reached. The default configuration is stored in the random access memory RAM2 in the inactive configuration state.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A data base for storing persistent data, corresponding to configuration data that is complete for configuring a terminal, comprising:
   a buffer into which is written persistent data to be permanently stored;
   a permanent memory connected to the buffer, the permanent memory having at least two storage areas, into which the persistent data alternately written, each storage area storing the configuration data that is complete for configuration of at least one of:
   (a) functions of the terminal,
   (b) characteristics of the terminal, and
   (c) cards of the terminal, at least one of the permanent configuration stored having a complete configuration available and being selected for hardware implementation,
   wherein the configuration data that is complete for configuration is alternately written into the storage areas by writing the complete configuration data into one of the storage areas completely and thereafter a later version of the configuration data is stored in the other storage area completely such that if the later version is lost during loading, the persistent data that is complete for configuration stored in at least one of the storage areas continues to exist and is recoverable, and wherein the persistent data stored in the buffer is alternately written into one of the storage units of the permanent memory; and a control mechanism with a first application process for management of a first memory controls writing of the data to be persistently stored into the buffer, the data being generated or modified by the first application process alone or also by other application processes running simultaneously with the first application process, wherein only modified data sequences are alternately written into storage segments of the permanent memory.

2. The data base according to claim 1, wherein the modified data sequences are written into the storage segments of the permanent memory at predetermined time intervals.

3. The data base according to claim 1, wherein the modified data sequences are written into the storage segments of the permanent memory after a predetermined number of modifications.

4. The data base according to claim 1, wherein only the persistent data, if necessary including reconstruction data, is transferred into the buffer from a first memory which contains a run-time program and associated permanent data.

5. The data base according to claim 4, wherein the persistent data is stored in a space-saving manner as a data sequence in the buffer and in the permanent memory.

6. The data base according to claim 1, wherein if construction data which is useable for reconstruction is present in the buffer, the configuration data to be written into the first memory is automatically recovered from the reconstruction data stored in the buffer.

7. The data base according to claim 1, wherein the permanent memory is a loadable Flash Erasable Programmable Read Only Memory chip.

8. The data base according to claim 1, wherein a number of configuration changes are only performed at a data management side and thereafter at least one of a functional and a hardware change comprising all configuration changes is performed in the terminal.

9. A data base for storing persistent data corresponding to configuration data that is complete for configuring a terminal, comprising:

a buffer into which is written persistent data to be permanently stored;

a permanent memory connected to the buffer, the permanent memory having at least first and second storage units, into which the persistent data is alternately written, each storage unit storing the configuration data that is complete for configuration of at least one of:
(a) functions of the terminal,
(b) characteristics of the terminal, and
(c) a hardware implementation, of a terminal or cards of the terminal, at least one of the permanent configurations stored having a complete configuration available and being selected for hardware implementation, wherein the configuration data that is complete for configuration is alternately written into the storage units by writing the complete configuration data into one of the storage units completely and thereafter a later version of the configuration data is stored in the other storage unit completely such that if the later version is lost during loading, the persistent data that is complete for configuration stored in at least one of the storage units continues to exist and is recoverable; and a control mechanism within a first application process for management of a first memory controls writing of the data to be persistently stored into the buffer, the data being generated or modified by the first application process alone or also by other application processes running simultaneously with the first application process.

10. The data base according to claim 9, wherein all of the persistent data is stored in the buffer is alternately written into one of the storage units of the permanent memory.

11. The data base according to claim 10, wherein only modified data sequences are alternately written into storage segments of the permanent memory.

12. The data base according to claim 11, wherein the modified data sequences are written into the storage segments of the permanent memory at predetermined time intervals.

13. The data base according to claim 11, wherein the modified data sequences are written into the storage segments of the permanent memory after a predetermined number of modifications.

14. The data base according to claim 9, wherein only the persistent data, if necessary including reconstruction data, is transferred into the buffer from a first memory which contains a run-time program and associated permanent data.

15. The data base according to claim 14, wherein the persistent data is stored in a space-saving manner as a data sequence in the buffer and in the permanent memory.

16. The data base according to claim 9, wherein the permanent memory is a loadable Flash Erasable Programmable Read Only Memory chip.

17. The data base according to claim 9, wherein a number of configuration changes are only performed at a data management side and thereafter at least one of a functional and a hardware change comprising all configuration changes is performed in the terminal.

18. A data base for storing persistent data corresponding to configuration data that is complete for configuring a terminal, comprising:

a buffer into which is written persistent data to be permanently stored;

a permanent memory connected to the buffer, the permanent memory having at least first and second storage units, into which the persistent data is alternately written, each storage unit being storing the configuration data that is complete for configuration of at least one of:
(a) functions of the terminal,
(b) characteristics of the terminal, and
(c) a hardware implementation, of a terminal or cards of the terminal, at least one of the permanent configurations stored having a complete configuration available and being selected for hardware implementation, wherein the buffer has at least first and second random access memories functionally connected in series, persistent data stored in the first random access memory being written into the second random access memory so that the first random access memory is available for reloading while persistent data from the second or a further random access memory is written into the permanent memory; and a control mechanism within a first application process for management of a first memory controls writing of the data to be persistently stored into the buffer, the data being generated or modified by the first application process alone or also by other application processes running simultaneously with the first application process.

19. The data base according to claim 18, wherein all of the persistent data is stored in the buffer is alternately written into one of the storage units of the permanent memory.

20. The data base according to claim 19, wherein only modified data sequences are alternately written into storage segments of the permanent memory.

21. The data base according to claim 20, wherein the modified data sequences are written into the storage segments of the permanent memory at predetermined time intervals.

22. The data base according to claim 20, wherein the modified data sequences are written into the storage segments of the permanent memory after a predetermined number of modifications.

23. The data base according to claim 18, wherein only the persistent data, if necessary including reconstruction data, is transferred into the buffer from a first memory which contains a run-time program and associated permanent data.

24. The data base according to claim 23, wherein the persistent data is stored in a space-saving manner as a data sequence in the buffer and in the permanent memory.

25. The data base according to claim 18, wherein if construction data which is useable for reconstruction is present in the buffer, the configuration data to be written into the first memory is automatically recovered from the reconstruction data stored in the buffer.

26. The data base according to claim 18, wherein the permanent memory is a loadable Flash Erasable Programmable Read Only Memory chip.

27. The data base according to claim 18, wherein a number of configuration changes are only performed at a data management side and thereafter at least one of a functional and a hardware change comprising all configuration changes is performed in the terminal.

* * * * *